United States Patent
Baek et al.

(10) Patent No.: US 7,073,959 B2
(45) Date of Patent: Jul. 11, 2006

(54) OPTICAL RECEIVER MODULE WITH TO-CAN STRUCTURE

(75) Inventors: Jae-Myung Baek, Suwon-si (KR); Ho-Seong Seo, Suwon-si (KR); Yu-Sik Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 297 days.

(21) Appl. No.: 10/733,123

(22) Filed: Dec. 11, 2003

(65) Prior Publication Data

US 2004/0264980 A1 Dec. 30, 2004

(30) Foreign Application Priority Data

Jun. 20, 2003 (KR) .................. 10-2003-0040298

(51) Int. Cl.
*G02B 6/36* (2006.01)
(52) U.S. Cl. .................. 385/92; 398/212; 398/214; 257/728
(58) Field of Classification Search .......... 398/202, 398/212, 214; 385/88, 89, 92; 257/433, 257/690, 728; 361/728, 730
See application file for complete search history.

(56) References Cited

U.S. PATENT DOCUMENTS

| | | | | |
|---|---|---|---|---|
| 5,179,461 A | * | 1/1993 | Blauvelt et al. .......... 398/202 |
| 5,814,871 A | * | 9/1998 | Furukawa et al. .......... 257/433 |
| 5,907,422 A | * | 5/1999 | Ho et al. .................. 398/209 |
| 6,900,512 B1 | * | 5/2005 | Kohmoto et al. .......... 257/435 |
| 6,977,423 B1 | * | 12/2005 | Kohmoto et al. .......... 257/431 |
| 2002/0136504 A1 | * | 9/2002 | Boscha ...................... 385/91 |

* cited by examiner

*Primary Examiner*—Michelle Connelly-Cushwa
*Assistant Examiner*—Daniel Petkovsek
(74) *Attorney, Agent, or Firm*—Cha & Reiter, L.L.C.

(57) ABSTRACT

An optical receiver module is disclosed with a top open can (TO-Can) structure that includes a stem with holes thereon. The holes pass through both sides of the stem. A photo diode mounted on an upper side of the stem, for converting an optical input signal into an electric current. The optical receiver module includes a trans-impedance amplifier, mounted on the upper side of the stem, converts the electric current output from the photo diode into RF signals having opposite phases, amplifies the converted RF signals, and outputs the amplified RF signals to the outside via corresponding output terminals. Signal leads, passing through the holes formed on the stem, output the RF signals having the opposite phases amplified by the trans-impedance amplifier to the outside. Ground leads, extending from a lower part of the stem, ground the stem to the outside of the optical receiver module. Waveguides, mounted in a predetermined position on the upper side of the stem, match impedances between the trans-impedance amplifier and the leads. The waveguides conduct the RF signals output from the output terminals of the trans-impedance amplifier to the respective leads via corresponding electric paths.

18 Claims, 7 Drawing Sheets

FIG.1

(PRIOR ART)

OPTICAL RECEIVER MODULE WITH TO-CAN STRUCTURE

CLAIM OF PRIORITY

This application claims priority under 35 U.S.C. § 119 to an application entitled "Optical Receiver Module with TO-Can Structure," filed in the Korean Intellectual Property Office on Jun. 20, 2003 and assigned Serial No. 2003-40298, the contents of which are incorporated herein by reference.

BACKGROUND OF THE INVENTION

1. Field of the Invention

The present invention relates generally to an optical receiver module, and in particular, to an optical receiver module with a top open can (hereinafter referred to as "TO-Can") structure for high-speed optical communication. The optical receiver module may include a photo diode for converting an optical input signal into an electric current.

2. Description of the Related Art

In order to meet the increasing demand for optical communication capacity, high-speed optical communication systems capable of supporting a rate of 10 GHz or higher have been developed. Such systems may include optical receiver modules having a butterfly structure in which active devices for optical transmission/reception are integrated on a flat form-type substrate, and a TO-Can structure in which the upper side of a stem on which active devices for optical transmission/reception are integrated is covered. Such optical modules have a low manufacturing cost and can widely be applied to various types of high-speed optical communication systems.

Figure 1:
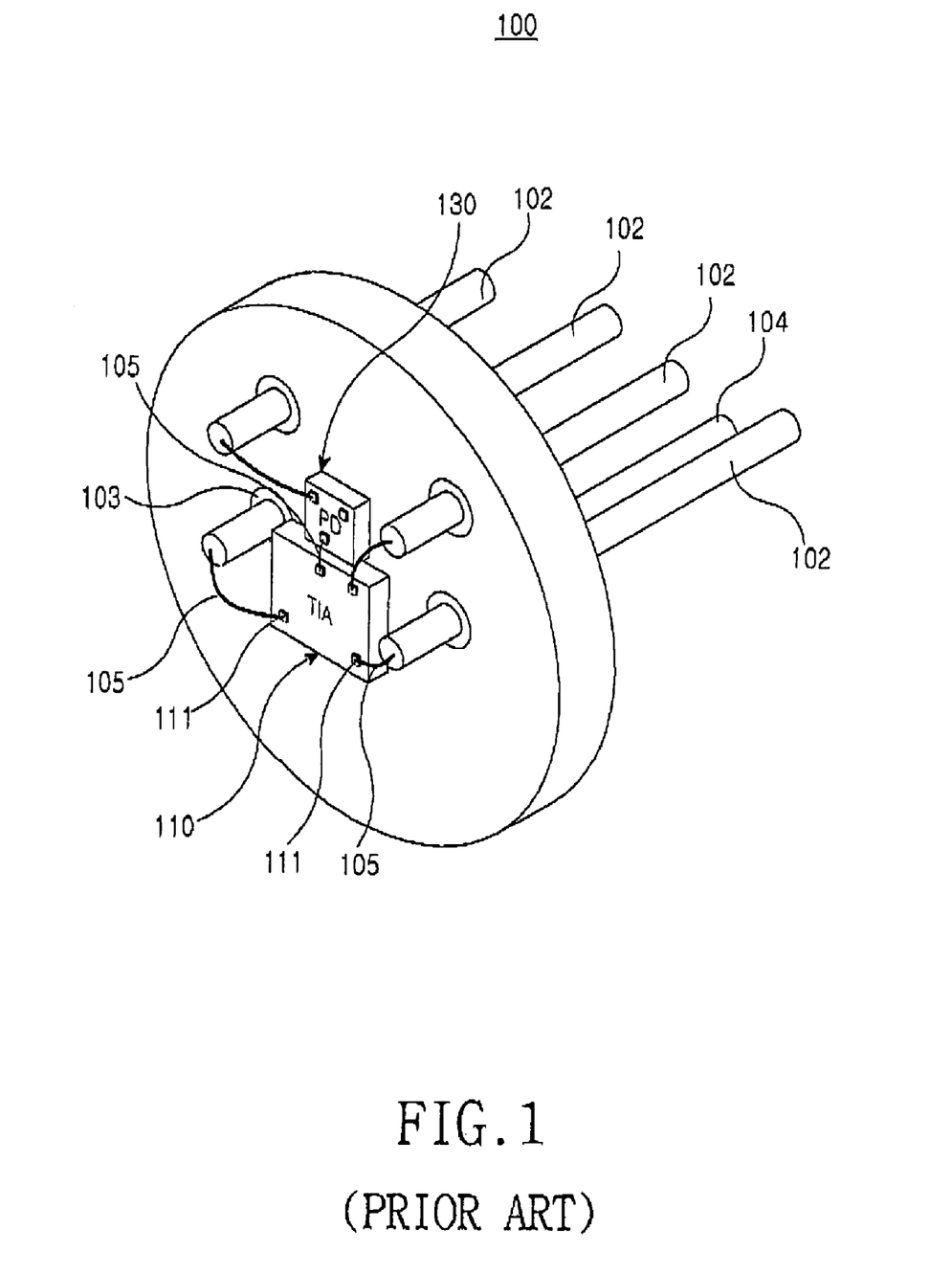
FIG. 1 is a perspective view illustrating a conventional optical receiver module with a TO-Can structure.

FIG. 1 is a perspective view illustrating a conventional optical receiver module 100 with a TO-Can structure. Referring to FIG. 1, the conventional optical receiver module 100 includes a stem 101 with a plurality of holes formed thereon, a plurality of leads 102, a photo diode (PD) or POB(PD on block) 130, and a trans-impedance amplifier (TIA) 110.

The photo diode 130 is mounted on an upper side of the stem 101, and converts an optical input signal into an electric current. The photo diode 130 has two terminals 131: one is an anode and the other is a cathode. The trans-impedance amplifier 110 amplifies and converts the electric current received from the photo diode 130 into high frequency (RF) signals having opposite phases, and conducts (or transmits) the amplified RF signals to the respective leads 102. To output the RF signals, the trans-impedance amplifier 110 includes two output terminals 111 for outputting the RF signals having the opposite phases.

Figure 2:
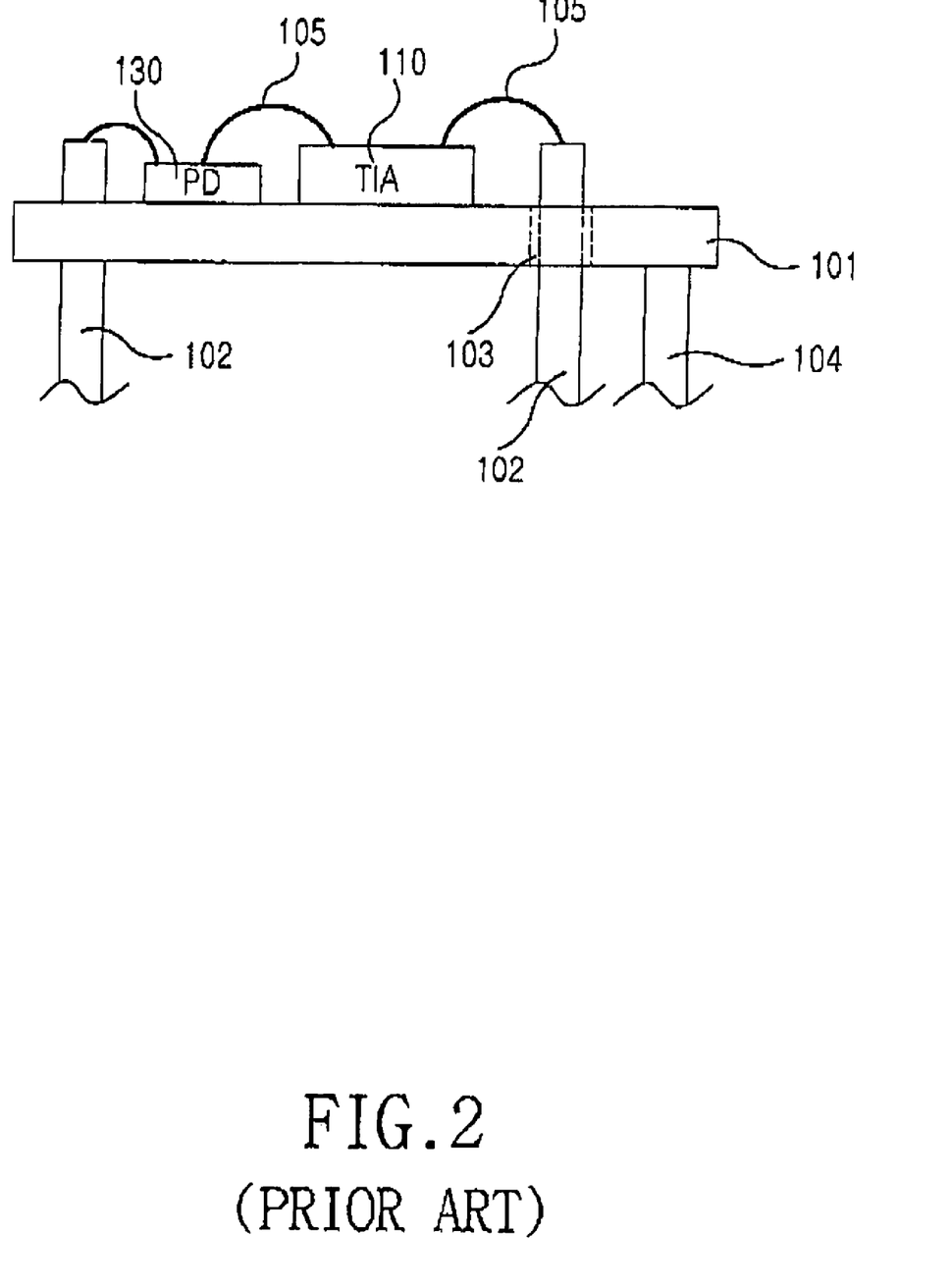
FIG. 2 is a partially enlarged cross sectional view illustrating the upper side of a stem and a lead passing through the upper side in the optical receiver module of FIG. 1.

The holes 103 (shown in FIG. 2), through which the leads 102 pass, are filled with sealing glass (not shown). The leads 102 may be fixed to the stem 101 at the same time the holes 103 are sealed. The leads 102 are connected to the trans-impedance amplifier 110, and classified into signal leads for outputting the RF signals to the outside of the optical receiver module and direct current (DC) leads for providing electric power to the photo diode 130 and the trans-impedance amplifier 110. The signal leads and the DC leads have the same shape.

The trans-impedance amplifier 110 is connected to the photo diode or POB(PD on block) 130 with a conductive wire 105 by wire bonding. Also, the leads 102 protruding from the upper side of the stem 101 are connected to the trans-impedance amplifier 110 with conductive wires 105 by wire bonding.

However, in the conventional optical receiver module, the trans-impedance amplifier 110 is directly connected to the conductive wires 105, causing an extensive increase in length of the conductive wires. The increase in length of the conductive wires 105 increases impedance and inductance. The increase in impedance of the conductive wires 105 causes impedance mismatching between the trans-impedance amplifier 110 and the leads. The leads 102 protruding from the upper side of the stem 101 add the inductance. Generally, the leads surrounded by glass seal 103 are not matched to 50 ohm.

Due to the impedance mismatching between the trans-impedance amplifier and the leads, parts of the RF signals output from the trans-impedance amplifier 110 are reflected from the leads back to the trans-impedance amplifier 110. Since a portion of the RF signals is reflected, the signal strength and bandwidth of RF signals output to the outside of the optical receiver module are reduced.

In addition, the impedance mismatching between the trans-impedance amplifier and the signals leads is increased when the optical receiver module is used for high-speed optical communication network. There is, thus, a need in the art for an optical receiver module with the TO-Can structure that can be used with high-speed optical communication network.

SUMMARY OF THE INVENTION

One object of the present invention is to provide an optical receiver module with a TO-Can structure capable that stably matches impedances between a trans-impedance amplifier and respective signal leads.

One embodiment of the present invention is directed to an optical receiver module with a top open can (TO-Can) structure including a stem with holes thereon, the holes passing through both sides of the stem, and a photo diode or POB(PD on block) mounted on an upper side of the stem, for converting an optical input signal into an electric current. The optical receiver module includes a trans-impedance amplifier mounted on the upper side of the stem, for converting and amplifying the electric current output from the photo diode into radio frequency (RF) signals having opposite phases, and outputting the RF signals to the outside via corresponding output terminals, signal leads passing through the holes formed on the stem, for outputting the RF signals having the opposite phases amplified by the trans-impedance amplifier to the outside ground leads extending from a lower part of the stem, for grounding the stem to the outside of the optical receiver module, and waveguides mounted in a predetermined position on the upper side of the stem in order to match impedance between the trans-impedance amplifier and the leads. The waveguides conduct the RF signals output from the output terminals of the trans-impedance amplifier to the respective leads via corresponding electric paths. The parts of signal leads in the holes formed on the stem is sealed with glass and matched to 50 ohm.

In another embodiment, the ground leads and the signal leads are arranged in the center of the stem. This makes it easy to align an optical axis of the optical receiver module with an optical axis of an optical transmitter module. In yet another embodiment, an optical transmitter module includes a laser diode mounted on the center of the stem and the signal leads are arranged in the center of the stem to minimize their distance from the laser diode and impedance mismatching.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will now be described in detail with reference to the annexed drawings. In the following description, a detailed description of known functions and configurations incorporated herein has been omitted for conciseness.

Figure 3:
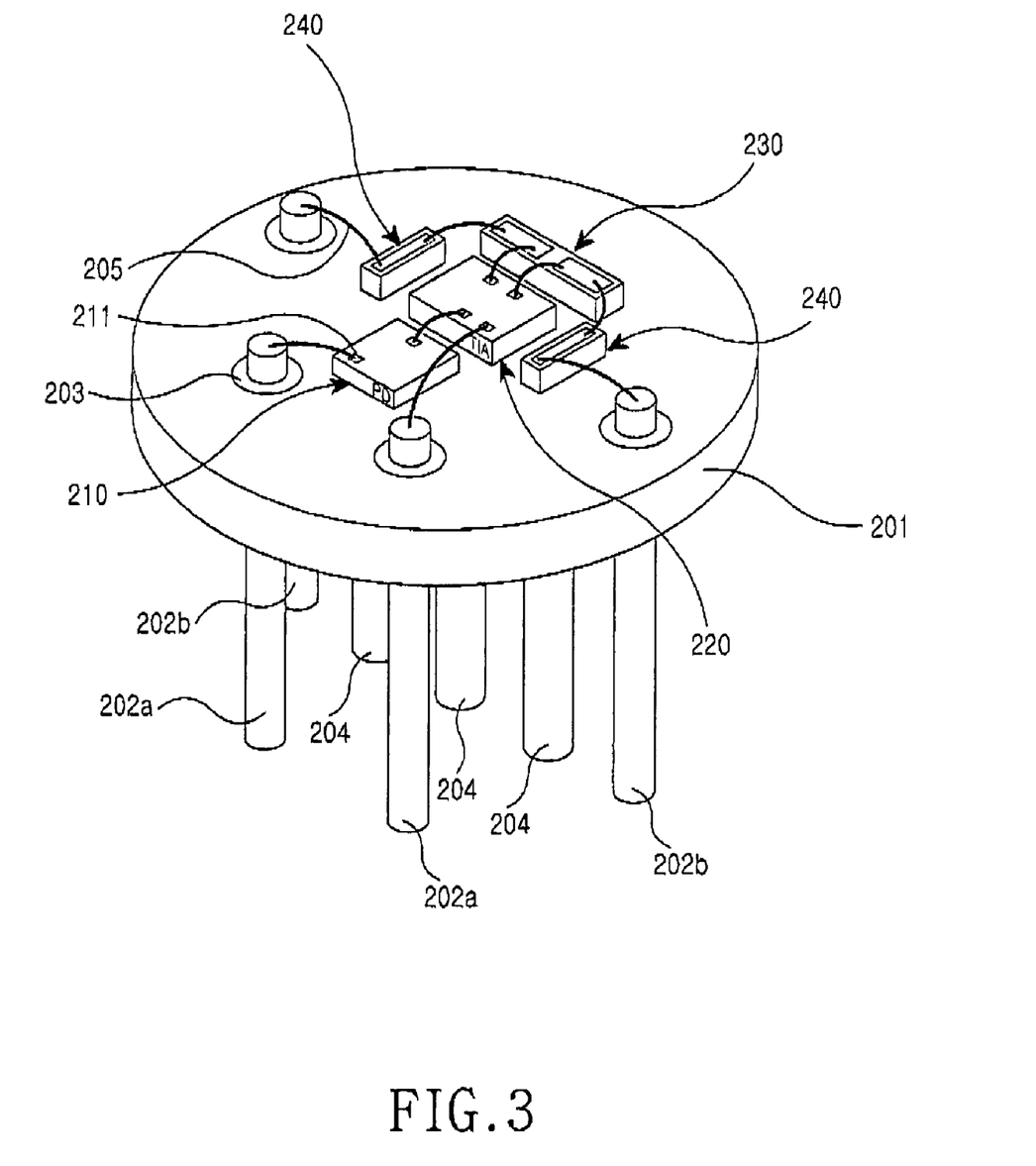
FIG. 3 is a perspective view illustrating an optical receiver module with a TO-Can structure according to an embodiment of the present invention.

FIG. 3 is a perspective view illustrating an optical receiver module with a TO-Can structure according to an embodiment of the present invention. Referring to FIG. 3, an optical receiver module 200 with a TO-Can structure includes a stem 201 with holes 203 passing through both sides thereof, a photo diode (PD) or POD (PD on block) 210 mounted on the upper side of the stem 201, a trans-impedance amplifier (TIA) 220 also mounted on the upper side of the stem 201, DC leads 202a passing through the holes 203 of the stem 201, signal leads 202b also passing through the holes 203 of the stem 201, ground leads 204, a first waveguide 230 and second waveguides 240.

The photo diode 210 converts an optical input signal into an electric current, and the electric current output from the photo diode 210 is applied to the trans-impedance amplifier 220. The photo diode 210 outputs its internal current to the trans-impedance amplifier 220 via a conductive wire 205 connected to the trans-impedance amplifier 220 by wire bonding. The photo diode 210 has terminals 211 for reverse biasing and transferring signals to the TIA, the terminals 211 serve as an anode and a cathode, respectively.

The trans-impedance amplifier 220 amplifies and converts the electric current received from the photo diode 210 into high frequency signals having opposite phases. The RF signals amplified by the trans-impedance amplifier 220 are output to the first waveguide 230 via output terminals of the trans-impedance amplifier 220. The output terminals of the trans-impedance amplifier 220 are connected to the first waveguide 230 with the conductive wires 205 by wire bonding.

Figure 4:
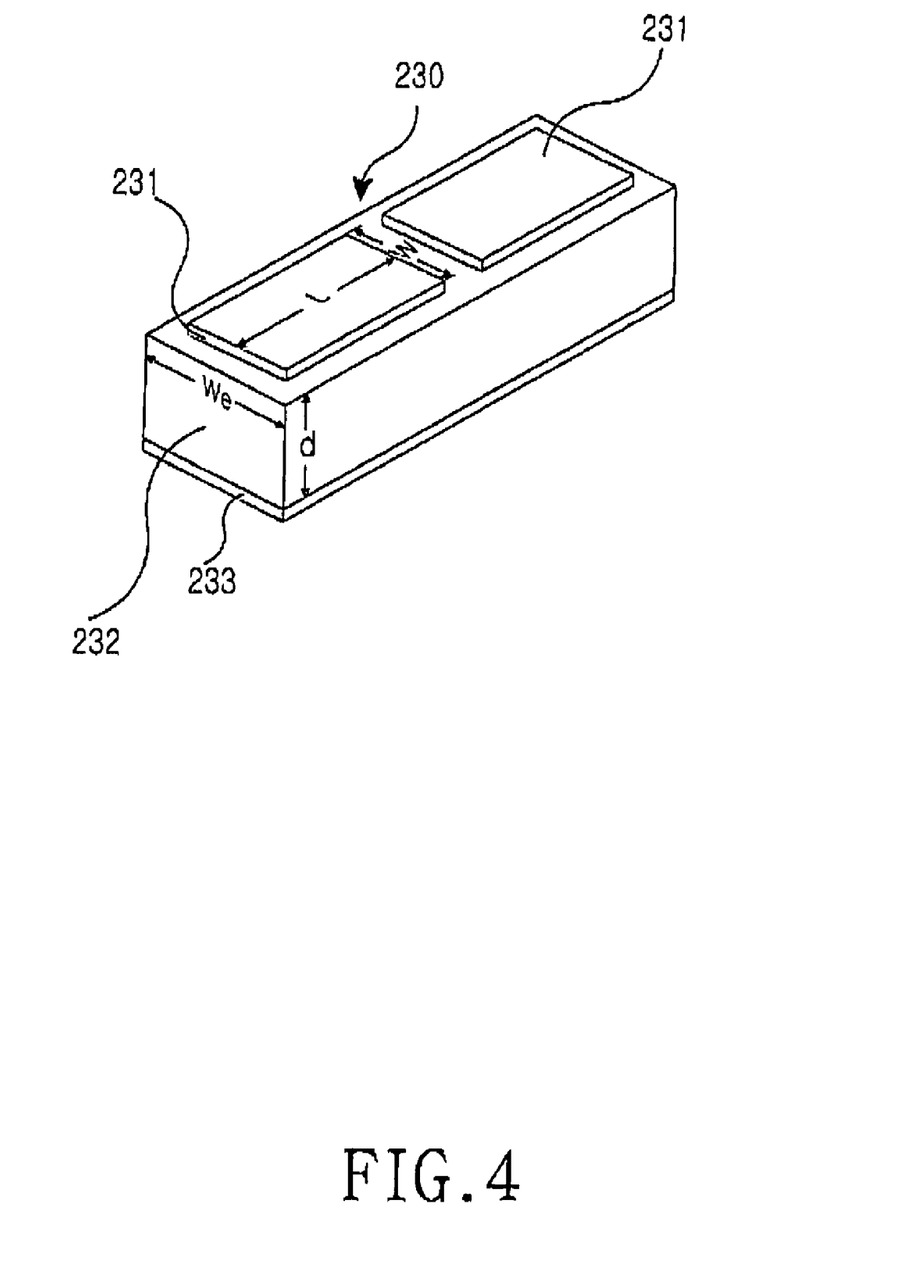
FIG. 4 is an enlarged perspective view of the first waveguide shown in FIG. 3.

FIG. 4 is an enlarged perspective view of the first waveguide 230 shown in FIG. 3. Referring to FIG. 4, the first waveguide 230 includes a dielectric layer 232, two first metal plates 231 formed to be separated from each other on the upper side of the dielectric layer 232. A second metal plate 233 is formed on the whole lower side of the dielectric layer 232. The second metal plate 233 is bonded to the upper side of the stem 201 to ground the first waveguide 230 to the stem 201. The second metal plate 233 can be removed when the dielectric layer 232 of waveguides are directly bonded with conductive cohesion agent to the upper side of the stem.

The first metal plates 231 of the first waveguide 230 are bonded to the output terminals of the trans-impedance amplifier 220 with the conductive wires 205 by wire bonding. The first metal plates 231 are also connected to their associated second waveguides 240 with the conductive wires 205 by wire bonding. By doing so, the RF signals having the opposite phases, output from the trans-impedance amplifier 220, are conducted to the corresponding second waveguides 240.

Figure 5:
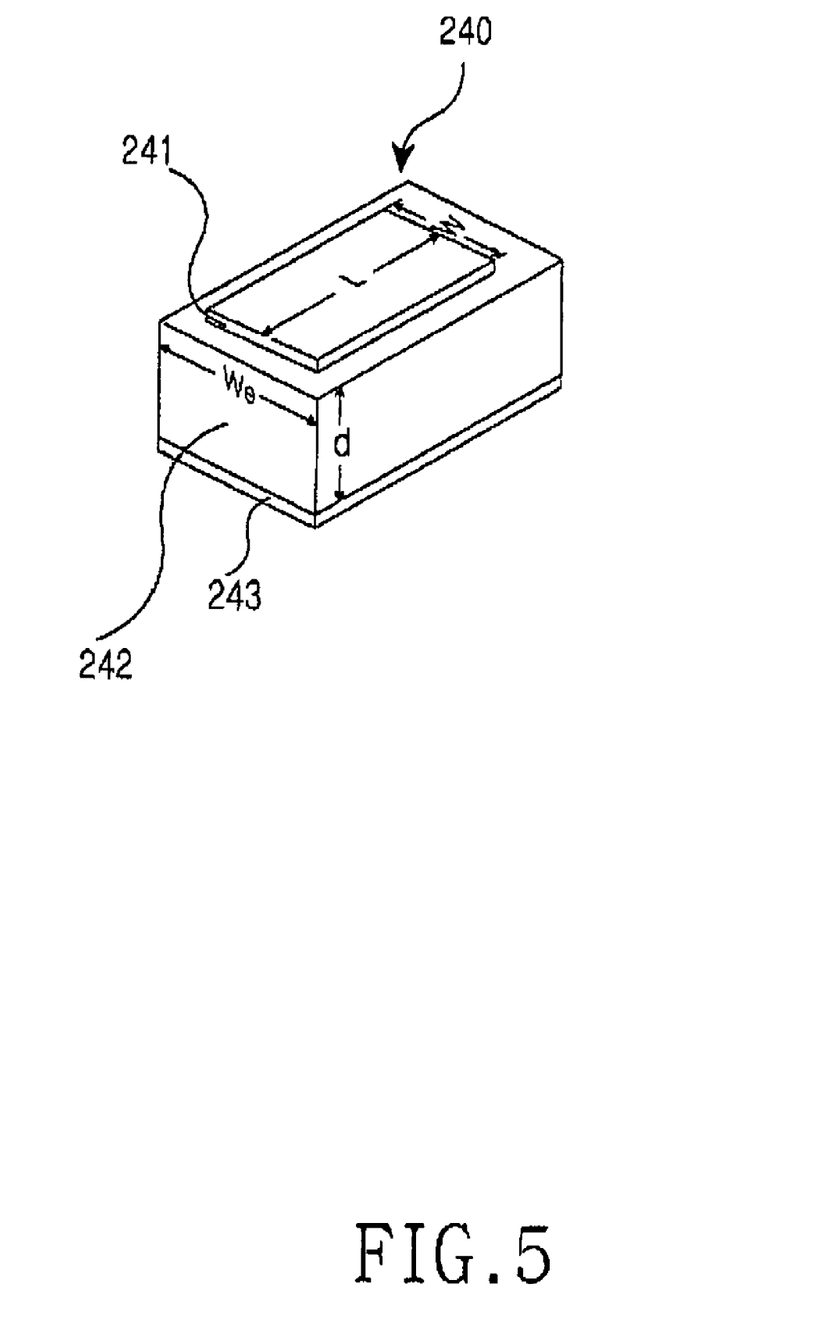
FIG. 5 is an enlarged perspective view of the second waveguides shown in FIG. 3.

FIG. 5 is an enlarged perspective view of the second waveguides 240 shown in FIG. 3. Referring to FIG. 5, each of the second waveguides 240 is mounted on the upper side of the stem 201, between the first waveguide 230 and the corresponding signal lead 220b, and the second waveguides are comprised of a dielectric layer 242, a first metal plate 241 for conducting a corresponding RF signal conducted from the first waveguide 230 to the corresponding signal lead 202b, and a second metal plate 243 formed on the lower side of the dielectric layer 242.

Each of the second waveguides 240 is mounted on the upper side of the stem 201, between the first waveguide 230 and the corresponding signal lead 220b. The first metal plate 241 of the second waveguide 240 has one end connected to the corresponding first metal plate 231 of the first waveguide 230 and the other end connected to the corresponding signal lead 202b with the conductive wires 205 by wire bonding. The second waveguide 240 conducts a corresponding RF signal conducted from the first metal plate 231 of the first waveguide 230 to the corresponding signal lead 202b.

As a result, the first and second waveguides 230 and 240 are mounted on the upper side of the stem 201 for impedance matching between the trans-impedance amplifier 220 and the signal leads 202b. In this way, they conduct the RF signals output from the output terminals of the trans-impedance amplifier 220 to the corresponding signal leads 202b via corresponding electric paths.

Each signal lead 202b is connected to the first metal plate 241 of the corresponding second waveguide 240 by wire bonding to output an RF signal having a corresponding phase conducted from the first metal plat 241 of the corresponding second waveguide 240 to the outside of the optical receiver module with the TO-Can structure.

The DC leads 202a are connected to the photo diode 210 and the TIA 220, respectively, to provide DC power to the photo diode 210 and the TIA 220. The DC leads 202a are separated from the signal leads 202b at a distance of about 1.1 mm. This enables a printed circuit board (PCB) having a thickness of about 1 mm to be inserted between the signal leads 202b and the DC leads 202a.

The signal leads 202b are coaxially-aligned with the holes 203 passing through both sides of the stem 201. The holes 203 are filled with sealing glass (now shown) so that the leads 202 are fixed to the stem 201 and at the same time, the holes 203 are sealed up. The sealed holes 203 have a coaxial structure adjusted to have the same characteristic impedance as an output impedance value of the trans-impedance amplifier 220 by a diameter of a corresponding signal lead 202b, a diameter of the hole 203, and a dielectric constant of the sealing agent. In contrast, the DC leads 202a have a structure in which they pass through the holes 203, since they do not require impedance matching.

The waveguides can also be formed to be bent, when necessary. However, for the convenience of manufacturing, the waveguides can be formed in the separated structure in which the first waveguide 230 is separated from the second waveguides 240, instead of the bent structure, and the waveguides are connected to the upper side of the stem 201 by a conductive adhesion agent. The shape and size of the waveguides can be appropriately determined according to a size of the stem 201, and a size and position of each element arranged on the stem 201.

In this embodiment of the present invention, the signal leads 202b are connected to the trans-impedance amplifier 220 with the first and second waveguides 230 and 240 having a microstrip line structure adjusted to have the lower characteristic impedance value as than output impedance value of the trans-impedance amplifier 220. This prevents a reduction and loss of the RF signals due to impedance mismatching between the signal leads 202b and the trans-impedance amplifier 220.

The characteristic impedance of the first and second waveguides 230 and 240 can be determined by Equation (1) below. When the first and second waveguides 230 and 240 have the same characteristic impedance as the trans-impedance amplifier 220, a loss of the RF signals can be minimized during transmission of the RF signals in the waveguides only.

$$Z_0 = \sqrt{\left(\frac{L_0}{C_0}\right)} \quad (1)$$

In Equation (1), $Z_0$ represents characteristic impedance of waveguides, $L_1$ represents inductance per unit length, and $C_0$ represents capacitance per unit length.

A general microstrip line is made in a state where a dielectric has a very wide width $W_e$ ($W_e \gg W$ (the width of the first metal)). However, the first and second waveguides 230 and 240 applied to the optical receiver module with the TO-Can structure are restricted in their sizes due to the internal space restriction of the TO can. For example, if the first metal plates 231 and 241, having a width W of 170 µm which is optimum value in the case of general microstrip line, is applied to the dielectric layers 232 and 242, having a width of 320 µm, thickness of 127 µm and dielectric constant of 6.15, an electric field fails to be spread wide and is restricted to the inside of the dielectric layers 232 and 242. Thus, capacitance per unit length is decreased, making it difficult to realize the characteristic impedance value of 50 Ω. However, in this case, if a width W of the first metal plates 231 and 241 is widened to 180 µm, it is possible to realize the first and second waveguides 230 and 240 having the characteristic impedance value of 50 Ω.

When RF signals are delivered from the trans-impedance amplifier 220 to the signal leads 202b via corresponding waveguides 230 and 240, the RF signals experience attenuation and impedance mismatching due to inductance of parts of the wire-bonded conductive wires 205 and the signal leads 202b protruding from the upper side of the stem 201. The degradation from the inductance is improved by increasing a width W of the first metal plates 231 and 241 of the respective waveguides 230 and 240. In this regard, an increase in a width W of the first metal plates 231 and 241 leads to an increase in a capacitance value of the first and second waveguides 230 and 240. By doing this, an impedance increase by the inductance is compensated, which reduces impedance mismatching.

Figure 6:
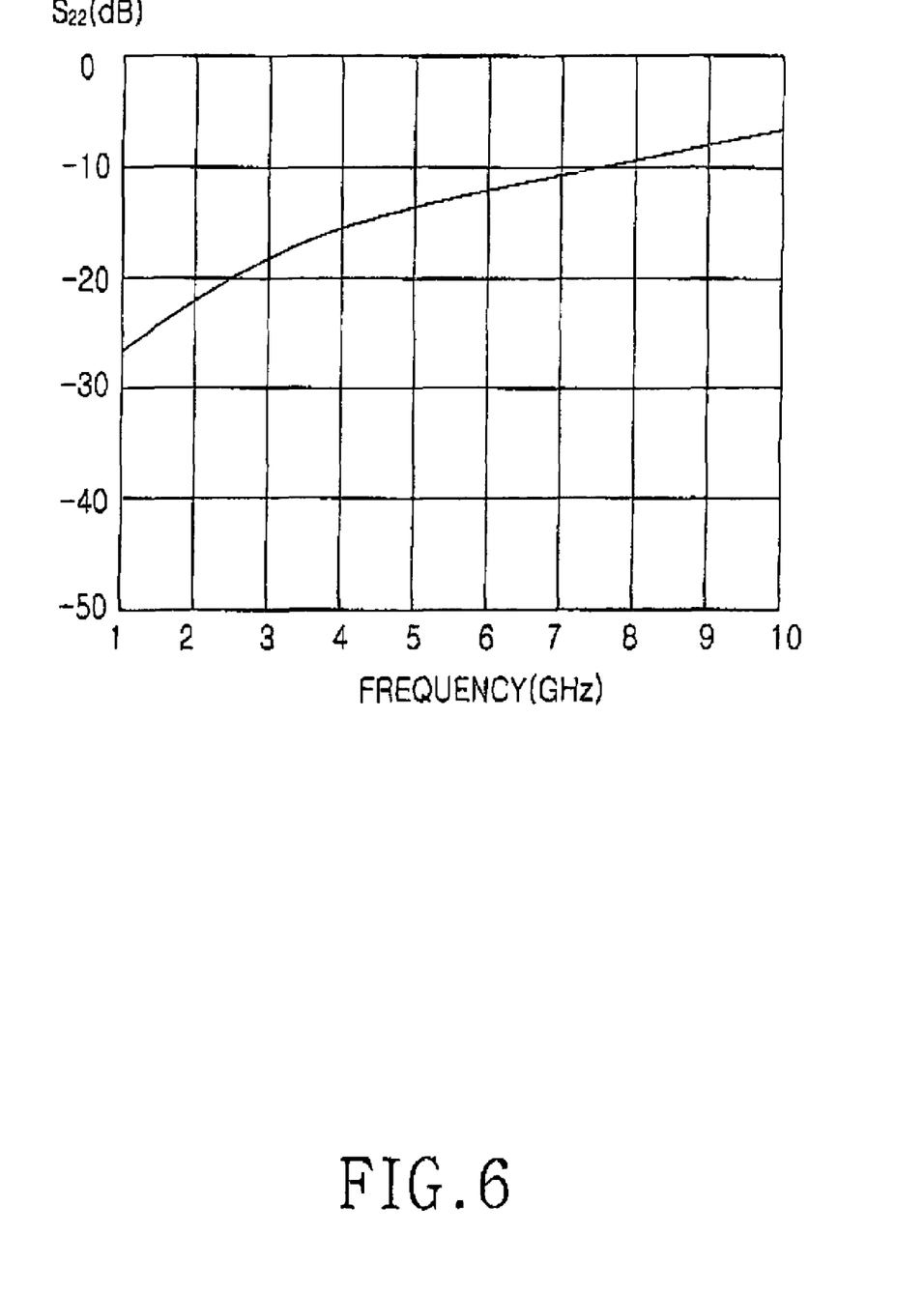
FIG. 6 is a graph illustrating an impedance matching characteristic of an RF signal output from an optical receiver module with a TO-Can structure when the trans-impedance amplifier is connected to each signal lead with a conductive wire having a length of 1 mm by wire bonding.

FIG. 6 is a graph illustrating an impedance matching characteristic of an RF signal output from the optical receiver module in accordance with one embodiment when the RF signal is delivered via a conductive wire with a length of 1 mm, connected from the trans-impedance amplifier to each signal lead by wire bonding.

Figure 7:
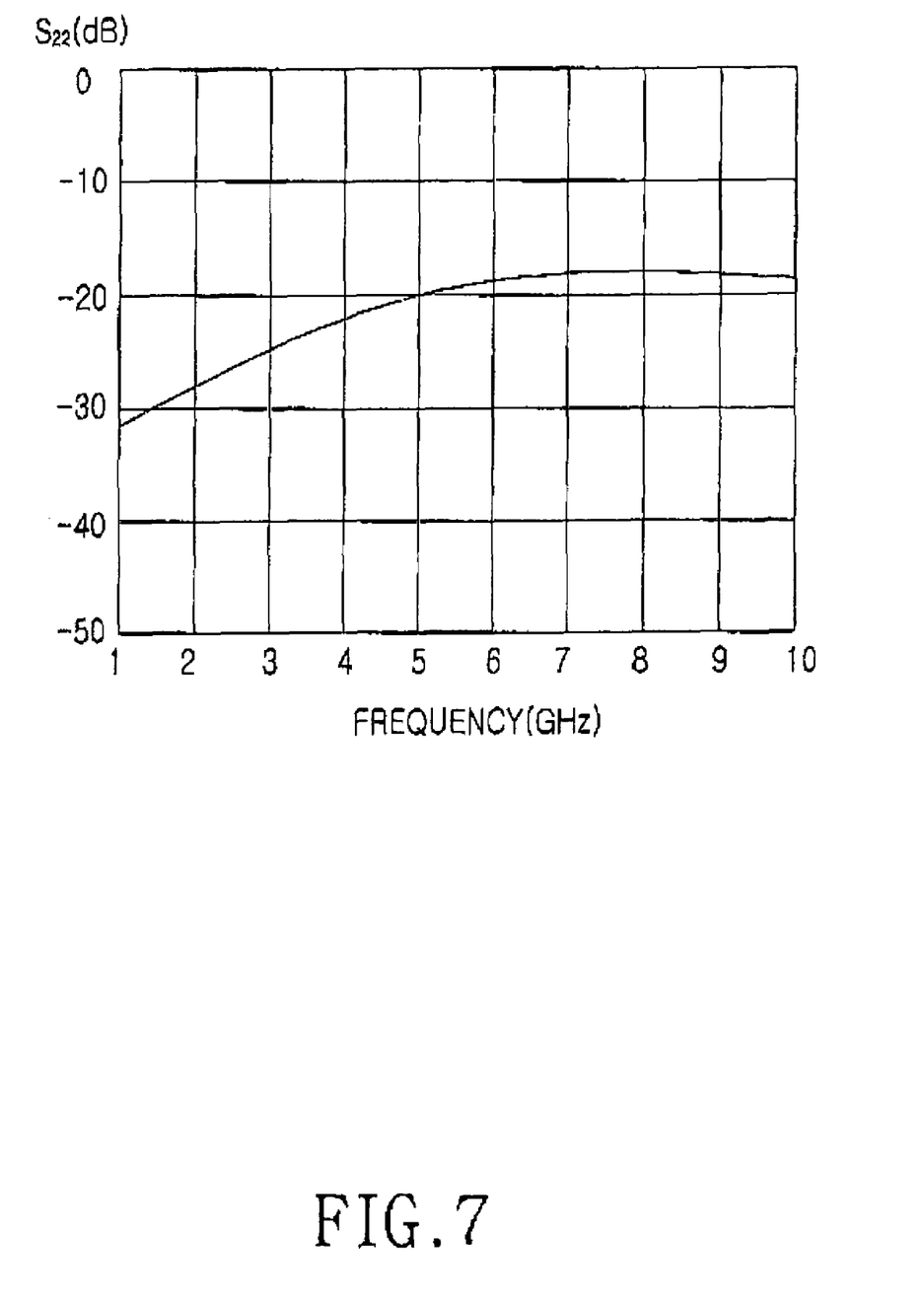
FIG. 7 is a graph illustrating an impedance matching characteristic when a width of first metal plates of a first waveguide is set to 250 μm and a width of a first metal plate of second waveguides is set to 300 μm.

FIG. 7 is a graph illustrating an impedance matching characteristic when a width of the first metal plates of the first waveguide is set to 250 µm and a width of the first metal plate of the second waveguides is set to 300 µm. FIG. 7 shows improved impedance matching characteristic as compared with the graph of FIG. 6.

In the first and second waveguides 230 and 240 applied to FIGS. 6 and 7, Ro3006 made by Rosers Co., having a dielectric constant of $\epsilon_r$=6.15, a loss tangent of 0.002, and a thickness of d=0.127 mm, was used as the dielectric layers 232 and 242.

The first waveguide 230 is comprised of the first metal plates 231, which are two copper layers having a thickness of 17.5 µm on which gold plated for wire bonding, formed to be separated on the upper side of the dielectric layer 232, for which Ro3006 made by Rosers Co. is used, and the second metal plate 233 which is copper layers, formed on the bottom side of the dielectric layer 232. The dielectric layer 232 has a width $W_e$ of 0.32 mm and a length L of 1.1 mm, and a width W of the first metal plate 231 formed on the dielectric layer 232 is 0.25 mm, which is slightly narrower than the width We of the dielectric layer 232.

The dielectric layer 242 of the second waveguides 240 has a length of 1,000 μm, and the dielectric layer 242 of the second waveguides 240 is identical to the dielectric layer 232 of the first waveguide 230 in a width $W_e$ and a thickness d. The dielectric layer 242 of the second waveguides 240 has the first metal plate 241 formed thereon, and the first metal plate 241 has a width W of 0.3 mm.

The second metal plate 233 of the first waveguide 230 can be bonded using a conductive cohesion agent, and the first waveguide 230 can be bonded to the upper side of the stem 201 by using the conductive cohesion agent.

The inductance values of bonding wires and the leads protruding from the upper side of the stem are around 0.2~0.6 nH and characteristics impedance of the first and second waveguide is 44 ohm and 40 ohm respectively. The optical receiver module according to the aspects of the present invention uses waveguides for impedance matching between the trans-impedance amplifier and the respective leads. This prevents a loss of RF signals due to impedance mismatching between the trans-impedance amplifier and the signal leads. In addition, a plurality of ground leads which are larger than signal leads extending from a lower part of the stem improves an electrical connection characteristic to the ground when the optical receiver module is installed in a PCB. The signal leads arranged in the center of the stem are aligned in an optical axis with an optical transmitter module in which signal lines are arranged in the center of a stem, thereby minimizing a characteristic loss when they are simultaneously installed in a PCB.

As described above, the present invention provides the ground leads having a cross-section larger than that of the signal leads. As a result, when an optical receiver module is mounted on a printed circuit board (PCB) in accordance with the present invention, a generation of inductance is minimized, thereby improving mechanical adhesion intensity between the optical receiver module and the printed circuit board (PCB). The section of the ground leads can be a circular or rectangular form.

While the invention has been shown and described with reference to a certain preferred embodiment thereof, it will be understood by those skilled in the art that various changes in form and details may be made therein without departing from the spirit and scope of the invention as defined by the appended claims.

The invention claimed is:

1. An optical receiver module with a top open can (TO-Can) structure including a stem with holes thereon, the holes passing through both sides of the stem, and a photo diode mounted on an upper side of the stem, for converting an optical input signal into an electric current, comprising:

a trans-impedance amplifier mounted on an upper side of the stem, for converting and amplifying the electric current output from the photo diode into radio frequency (RF) signals having opposite phases, and outputting the amplified RF signals to the outside via corresponding output terminals;

signal leads passing through the holes formed on the stem, for outputting the RF signals having the opposite phases amplified by the trans-impedance amplifier to the outside;

ground leads extending from the stem, for grounding the stem to the outside of the optical receiver module; and waveguides mounted in a predetermined position on an upper side of the stem in order to match impedance between the trans-impedance amplifier and the leads, the waveguides conducting the RF signals output from the output terminals of the trans-impedance amplifier to the respective leads via corresponding electric paths.

2. The optical receiver module of claim 1, wherein the waveguides comprise:

a first waveguide for conducting the RF signals having the opposite phases, output via the output terminals of the trans-impedance amplifier, through corresponding electric paths; and second waveguides interposed between the first waveguide and the leads, for conducting the RF signals having the opposite phases, conducted from the first waveguide, to the corresponding signal leads.

3. The optical receiver module of claim 2, wherein the first waveguide comprises:

a dielectric layer;

a first and second metal plates formed to be separated from each other on the dielectric layer, the first metal plates being wire-bonded to the output terminals of the trans-impedance amplifier to conduct the RF signals having the opposite phases, output from the output terminals of the trans-impedance amplifier, to the second waveguides via corresponding electric paths; and a third metal plate formed on a lower side of the dielectric layer, the third metal plate being bonded to the upper side of the stem to ground the first waveguide to the stem.

4. The optical receiver module of claim 3, wherein the second metal plate is a conductive cohesion agent applied between the dielectric layer and the upper side of the stem.

5. The optical receiver module of claim 3, wherein a width of the dielectric layer of the first waveguide is formed to approximate a width of the first metal plate, so that an electric field is restricted to an inside of the dielectric layer.

6. The optical receiver module of claim 3, wherein the first and second waveguides adjust impedances of the first and second waveguides by adjusting a width of the first metal plate and a dielectric constant and a thickness of the dielectric layer.

7. The optical receiver module of claim 3, wherein the first and second waveguides reduce a signal loss and impedance mismatching due to inductance components of the signal leads protruding from an upper part of the stem and the wire-bonded conductive wires, by adjusting impedance of the first and second waveguides by adjusting a width of the first metal plate and a dielectric constant of the dielectric layer and/or a thickness of the dielectric layer.

8. The optical receiver module of claim 2, wherein each of the second waveguides comprises:

a dielectric layer;

a first metal plate for conducting a corresponding RF signal conducted from the first waveguide, to a corresponding lead; and a second metal plate formed on a lower side of the dielectric layer, the second metal plate being bonded to the upper side of the stem to ground the first waveguide to the stem.

9. The optical receiver module of claim 8, wherein a width of the dielectric layer of the second waveguide is formed to approximate a width of the first metal plate, so that an electric field is restricted to an inside of the dielectric layer.

10. The optical receiver module of claim 1, further comprising sealing glass provided in an empty space between the holes and the leads to fix the signal leads to the stem.

11. The optical receiver module of claim 1, wherein the signal leads extending from the stem have a coaxial cable structure, and are impedance-matched to the trans-impedance amplifier.

12. The optical receiver module of claim 1, wherein the first and second waveguides prevent a signal loss and impedance mismatching due to inductance components of the signal leads protruding from an upper part of the stem and the wire-bonded conductive wires, by adjusting characteristic impedance of the first and second waveguides.

13. The optical receiver module of claim 1, further comprising a pair of direction current (DC) leads protruding from the upper side of the stem in order to apply a DC power to the photo diode and the TIA.

14. The optical receiver module of claim 1, wherein electric connection between the first and second waveguides, electric connection between the first waveguide and the trans-impedance amplifier, and electric connection between the signal leads and the corresponding second waveguides are made with conductive wires by wire bonding.

15. The optical receiver module of claim 1, wherein respective terminals of the photo diode are electrically connected to the DC leads with conductive wires by wire bonding.

16. The optical receiver module of claim 1, wherein the signal leads and the ground leads are arranged in a center of the stem to align an optical axis of the optical receiver module with an optical axis of an optical transmitter module, so that when they are mounted on one printed circuit board (PCB), a loss of an RF signal and impedance mismatching are minimized.

17. The optical receiver module of claim 16, wherein a cross-section of the ground leads is substantially larger than that of the signal leads are circular forms.

18. The optical receiver module of claim 16, wherein a cross-section of the ground leads is substantially larger than that of the signal leads are rectangular forms.

* * * * *